United States Patent [19]
Kuroda et al.

[11] Patent Number: 5,746,233
[45] Date of Patent: May 5, 1998

[54] WASHING APPARATUS AND METHOD THEREFOR

[75] Inventors: Takeshi Kuroda, Hyogo; Itaru Kanno, Tokyo, both of Japan

[73] Assignees: Mitsubishi Denki Kabushiki Kaisha, Tokyo; Ryoden Semiconductor System Engineering Corporation, Itami, both of Japan

[21] Appl. No.: 678,685

[22] Filed: Jul. 11, 1996

[30] Foreign Application Priority Data

Jan. 17, 1996 [JP] Japan .................................. 8-005711

[51] Int. Cl.[6] .................................................. B08B 3/04
[52] U.S. Cl. ...................... 134/57 R; 134/108; 134/111; 134/902
[58] Field of Search .................... 134/57 R, 108, 134/111, 902

[56] References Cited

U.S. PATENT DOCUMENTS

| | | | |
|---|---|---|---|
| 3,074,277 | 1/1963 | Hill | 134/57 R X |
| 3,427,198 | 2/1969 | Hill | 134/57 R X |
| 3,880,685 | 4/1975 | Rehm et al. | 134/902 X |
| 3,964,956 | 6/1976 | Snyder | 134/902 X |
| 5,361,789 | 11/1994 | Yoshida et al. | 134/902 X |

FOREIGN PATENT DOCUMENTS

| | | | |
|---|---|---|---|
| 175181 | 7/1983 | Japan | 134/902 |
| 254125 | 11/1991 | Japan | 134/902 |
| 67601 | 3/1993 | Japan | 134/902 |
| 234977 | 9/1993 | Japan | 134/902 |
| 29271 | 2/1994 | Japan | 134/902 |

*Primary Examiner*—Philip R. Coe
*Attorney, Agent, or Firm*—Oblon, Spivak, McClelland, Maier & Neustadt, P.C.

[57] ABSTRACT

Obtained are a washing apparatus inhibiting a washing liquid from losing its washability and a method therefor. A circulating pump (5) circulates a washing liquid (3) successively through a heater (6), a filter (7), and an overflow washing tank (2). The washing liquid (3) is gradually evaporated. On the other hand, a water supplier (10) supplies the overflow washing tank (2) with water through a tube (8). An amine supplier (11) supplies the overflow washing tank (2) with amines through a tube (9). A control unit (12) controls the quantities of the water and amines as supplied. In a washing part (50), therefore, the quantities of the water and amines are inhibited from being reduced upon a lapse of time from operation starting, whereby the washing liquid (3) is inhibited from losing its washability.

7 Claims, 7 Drawing Sheets

WASHING APPARATUS AND METHOD THEREFOR

BACKGROUND OF THE INVENTION

1. Field of the Invention

The present invention relates to a washing apparatus for washing the surface of a semiconductor wafer with a washing liquid, and more particularly, it relates to a washing apparatus for washing a semiconductor wafer through the characteristics of a washing liquid and a method therefor.

2. Description of the Background Art

FIG. 13 illustrates a conventional washing apparatus for a semiconductor wafer employing water and amines. Referring to FIG. 13, numeral 1 denotes a semiconductor wafer, numeral 2 denotes an overflow washing tank which is adapted to store and wash the semiconductor wafer 1, numeral 3 denotes a washing liquid mainly containing water and amines for washing the semiconductor wafer 1, numeral 4 denotes a circulating line for circulating the washing liquid 3, numeral 5 denotes a circulating pump which is circulating means for circulating the washing liquid 3, numeral 6 denotes a heater which is temperature control means for controlling the temperature of the washing liquid 3, and numeral 7 denotes a filter for filtering the washing liquid 3.

The structure is now described. A first end of the circulating pump 5 is connected to that of the heater 6 through the circulating line 4. A second end of the heater 6 is connected to a first end of the filter 7 through the circulating line 4. A second end of the filter 7 is connected to the overflow washing tank 2 through the circulating line 4. A second end of the circulating pump 5 is connected to the overflow washing tank 2 through the circulating line 4.

The operation is now described. The circulating pump 5 circulates the washing liquid 3 successively through the heater 6, the filter 7 and the overflow washing tank 2. The heater 6 heats the washing liquid 3, thereby controlling its temperature. The washing liquid 3 dissolves an organic substance. On the other hand, an etching residue which is an organic substance such as resist adheres to the surface of the semiconductor wafer 1. Thus, the etching residue adhering to the surface of the semiconductor wafer 1 is dissolved in the washing liquid 3 during circulation thereof. Consequently, the semiconductor wafer 1 is washed. In starting of the operation, the water and amines are mixed in concentration providing the washing liquid 3 with washability capable of excellently washing the semiconductor wafer 1.

In the conventional washing apparatus having the aforementioned structure, however, the water and amines which are contained in the washing liquid 3 are rapidly evaporated as the time elapses from operation starting of the washing apparatus, due to the heating and circulation of the washing liquid 3. Thus, the washing liquid 3 loses its washability through such evaporation of the water and amines, and hence the etching residue adhering to the surface of the semiconductor wafer 1 is not washed. Further, the washing liquid 3 losing its washability must be exchanged by a new one.

SUMMARY OF THE INVENTION

According to a first aspect of the present invention, a washing apparatus comprises a washing part for washing a wafer with a washing liquid, and a supply part for supplying the washing part with the washing liquid by a quantity which is reduced following a lapse of a used time on the basis of a characteristic curve indicating the relation between the used time and the quantity of the washing liquid.

According to a second aspect of the present invention, the washing liquid contains a plurality of solutions, and the characteristic curve includes a plurality of characteristic curves corresponding to the plurality of solutions respectively, while the supply part includes supply means for supplying the washing part with one solution having the minimum used time reducing the quantity of the solution and making the washing liquid lose its washability among the plurality of solutions.

According to a third aspect of the present invention, the plurality of solutions contain water and amines.

According to a fourth aspect of the present invention, the washing part includes a washing tank for washing the wafer with the washing liquid, a filter for filtering the washing liquid, circulating means for passing the washing liquid stored in the washing tank through the filter and returning the same in the washing tank again, and temperature control means for controlling the temperature of the washing liquid, and the supply part comprises water supply means for supplying the washing tank with the water, and control means for controlling the water supply means thereby adjusting the quantity of the water.

According to a fifth aspect of the present invention, the supply part further comprises amine supply means for supplying the washing tank with the amines, and the control means controls the water supply means and the amine supply means thereby adjusting the supply quantities of the water and the amines.

According to a sixth aspect of the present invention, the supply means further comprises weight measuring means for measuring the weight of the washing liquid, so that the washing liquid is supplied also by a result of measurement of the weight measuring means.

According to a seventh aspect of the present invention, the supply means further comprises concentration measuring means for measuring the concentration of the washing liquid, so that the washing liquid is supplied also by a result of measurement of the concentration measuring means.

According to an eighth aspect of the present invention, a washing apparatus comprises a washing liquid containing water, amines and still another solution, a washing part for washing a wafer with the washing liquid, weight measuring means for measuring the weight of the washing liquid, and a supply part for supplying the washing part with at least the water among the water, the amines and the still another solution which are contained in the washing liquid in response to the weight of the washing liquid measured by the weight measuring means.

According to a ninth aspect of the present invention, a washing method comprises a first step of preparing a wafer, a second step of washing the wafer with a washing liquid containing water and amines, and a third step of supplying at least water on the basis of a characteristic curve indicating the relation between a used time and the quantity of the washing liquid in parallel with the second step.

According to a tenth aspect of the present invention, the washing method further comprises a fourth step of measuring the weight of the washing liquid in parallel with the second step, and a fifth step of supplying at least water in response to the weight of the washing liquid measured in the fourth step.

According to an eleventh aspect of the present invention, a washing method comprises a first step of preparing a wafer, a second step of washing the wafer with a washing liquid containing water and amines, a third step of measuring the weight or concentration of the washing liquid in parallel with the second step, and a fourth step of supplying at least water in response to the weight of the washing liquid measured in the third step.

According to a twelfth aspect of the present invention, the washing part includes a washing tank for washing the wafer with the washing liquid, a filter for filtering the washing liquid, circulating means for passing the washing liquid stored in the washing tank through the filter and returning the same in the washing tank again, and temperature control means for controlling the temperature of the washing liquid, and the supply part comprises water supply means for supplying the washing tank with the water, and control means for receiving a result of measurement of the weight measuring means and controlling the water supply means in response to the result of measurement for adjusting the supply quantity of the water in the washing apparatus according to the eighth aspect of the present invention.

According to a thirteenth aspect of the present invention, the supply part further comprises amine supply means for supplying the washing tank with the amines, and the control means controls the water supply means and the amine supply means in response to the result of measurement for adjusting the supply quantities of the water and the amines in the washing apparatus according to the thirteenth aspect of the present invention.

According to the first aspect of the present invention, the washing liquid can be supplied in response to its characteristic curve, whereby the washability of the washing liquid can be so effectively controlled that the washing liquid can be inhibited from losing its washability upon a lapse of time from operation starting of the washing apparatus.

According to the second aspect of the present invention, it is possible to effectively obtain the washing apparatus which can inhibit the washing liquid from losing its washability in an early stage upon a lapse of time from operation starting of the washing apparatus simply by supplementing not all but only parts of solutions contained in the washing liquid.

According to the third aspect of the present invention, the washing apparatus can be effectively applied to a washing liquid containing water and amines, which is now forming the main stream of a future washing liquid.

According to the fourth aspect of the present invention, it is possible to effectively inhibit the washing liquid from losing its washability in an early stage upon a lapse of time from operation starting of the washing apparatus by supplying the washing tank with water through the water supply means while adjusting the quantity of water through the control means in order to compensate for the washing liquid which is evaporated by circulation through the circulating means and heating through the temperature control means.

According to the fifth aspect of the present invention, it is possible to effectively inhibit the washing liquid from losing its washability upon a lapse of time from operation starting of the washing apparatus by supplying the washing tank with amines by the amine supply means while also adjusting the quantities of the amines by the control means.

According to the sixth aspect of the present invention, the quantity of the washing liquid can effectively be correctly managed by directly measuring the weight of the washing liquid through the weight measuring means.

According to the seventh aspect of the present invention, the quantity of the washing liquid can effectively be correctly managed by directly measuring the concentration of the washing liquid through the concentration measuring means.

According to the eighth aspect of the present invention, it is possible to effectively inhibit the washing liquid from losing its washability upon a lapse of time from operation starting of the washing apparatus even if the quantity of the washing liquid is reduced while the washing part washes the wafer, when the supply part supplies at least water in response to the weight which is measured by the weight measuring means.

According to the ninth aspect of the present invention, it is possible to effectively inhibit the washing liquid from losing its washability upon a lapse of time from operation starting of the washing apparatus even if the quantity of the washing liquid is changed while the washing part washes the wafer, by supplying at least water in response to the characteristic curve of the washing liquid.

According to the tenth aspect of the present invention, at least the quantity of water can effectively be correctly managed by measuring the weight of the washing liquid and supplying at least water in response to the measured weight.

According to the eleventh aspect of the present invention, it is possible to effectively inhibit the washing liquid from losing its washability upon a lapse of time from operation starting of the washing apparatus even if the quantity of the washing liquid is changed while the washing part washes the wafer, by supplying at least water in response to the measured weight or concentration of the washing liquid.

According to the twelfth aspect of the present invention, the washing liquid which is evaporated by the circulation by the circulating means and the heating by the temperature control means is supplemented by the water supply means while the control means controls the quantity of water in response to the result of measurement of the weight measuring means, whereby the washing liquid can be effectively inhibited from losing its washability in an early stage upon a lapse of time from operation starting of the washing apparatus.

According to the thirteenth aspect of the present invention, the control means adjusts the quantities of amines in response to the result of measurement of the weight measuring means while the amine supply means supplies the washing tank also with the amines, whereby the washing liquid can be effectively inhibited from losing its washability upon a lapse of time from operation starting of the washing apparatus.

Accordingly, an object of the present invention is to provide a washing apparatus which inhibits a washing liquid from losing its washability upon a lapse of time after operation starting and a method therefor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
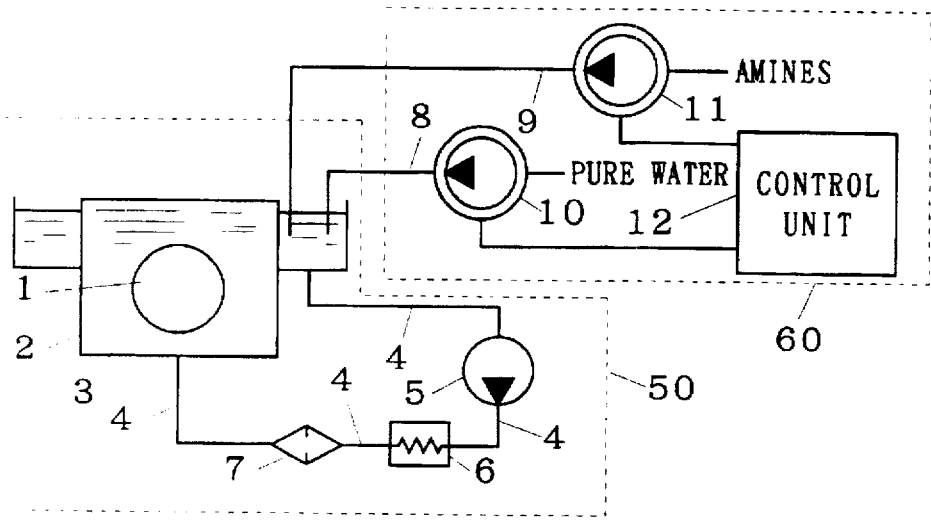
FIG. 1 illustrates a washing apparatus for a semiconductor wafer employing water and amines according to an embodiment 1 of the present invention.
Figure 13:
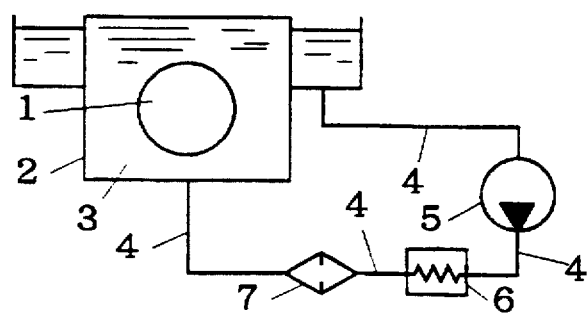
FIG. 13 illustrates a conventional washing apparatus for a semiconductor wafer employing water and amines.

FIG. 1 illustrates a washing apparatus for a semiconductor wafer employing water and amines according to an embodiment 1 of the present invention. Referring to FIG. 1, numeral 8 denotes a tube for adding water (pure water), numeral 9 denotes a tube for adding amines (organic amines), numeral 10 denotes a water supplier which is a supply means for supplying water to an overflow washing tank 2 through the tube 8, numeral 11 denotes an amine supplier which is an amine supply means for supplying amines through the tube 9, numeral 12 denotes a control unit which is control a means for controlling the water supplier 10 and the amine supplier 11 for adjusting the supply quantities of water and amines, and the remaining numerals correspond to those in FIG. 13.

The structure is now described. An end of the water supplier 10 is supplied with water. The other end of the water supplier 10 is connected to the overflow washing tank 2 through the tube 8. An end of the amine supplier 11 is supplied with amines. The other end of the amine supplier 11 is connected to the overflow washing tank 2 through the tube 9. The water supplier 10 and the amine supplier 11 are connected to the control unit 12. The remaining structure is similar to that of the washing apparatus shown in FIG. 13. The control unit 12 includes a timer for measuring a time (elapsed time) from operation starting of the washing apparatus.

A washing part 50 is formed by a semiconductor wafer 1, the overflow washing tank 2, a washing liquid 3, a circulating line 4, a circulating pump 5, a heater 6 and a filter 7. A supply part 60 is formed by the tubes 8 and 9, the water supplier 10, the amine supplier 11 and the control unit 12.

Figure 2:
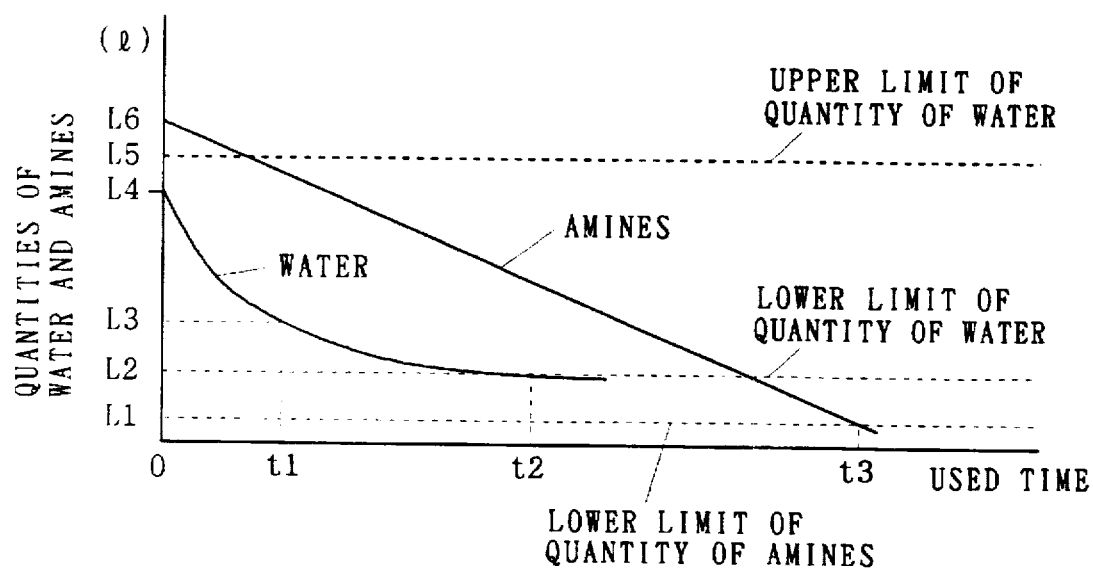
FIG. 2 illustrates characteristic curves indicating the relation between used times from operation starting and water and amines contained in a washing liquid.

FIG. 2 illustrates characteristic curves indicating the relations between used times from operation starting and quantities of water and amines, which are solutions contained in the washing liquid 3. The axis of abscissas shows the used times (i.e., time in use) from operation starting time, and the axis of ordinates shows the quantities of water and amines (unit:liters) respectively. The washing liquid 3 is formed by water, amines, and remaining solutions. While the water and amines are evaporated, the remaining solutions are not. The quantity of water is largely reduced around the operation starting time, while the quantity of such reduction is gradually reduced with time. On the other hand, the amines are evaporated at a substantially constant rate from the operation starting time.

At the operation starting time, the water and the amines are mixed with each other in quantities having excellent washability for an etching residue. For example, the quantities L4 and L6 of water and amines are set at not more than 50 percent and at least 50 percent of the quantity of the overall washing liquid 3 respectively at the time of operation starting. The temperature of the washing liquid 3 is adjusted at 65° C.

The process for providing the washing liquid 3 with washability is now described. When the water and the amines are mixed with each other, ionization of the amines (formation of hydroxide ions) progresses. The ionized amines decompose the etching residue etc., whereby the washing liquid 3 has washability characteristics. Thus, the washing liquid 3 first attains a washability characteristic for the etching residue etc. upon mixture of the aforementioned plural solutions.

Therefore, the washability characteristics of the washing liquid 3 depends on the quantities of the water and the amines. The washing liquid 3 loses its washability characteristic if the quantity of water is too low, and hence the quantity of water is provided with a lower limit L2 capable of providing the washing liquid 3 with a good washability characteristic. The quantity of amines is also provided with a lower limit L1 capable of providing the washing liquid 3 with a washability characteristic. In order to provide the washing liquid 3 with a good washability characteristic, therefore, the quantities of water and amines must be in excess of the lower limits L2 and L1 respectively. Symbols t2 and t3 denote used times at which the quantities of water and amines reach the lower limits L2 and L1 respectively.

If the quantities of water and amines are too large, on the other hand, the washability is so excessively increased that, in the worst case, a metal (Al or the like) of the semiconductor wafer 1 is dissolved. Therefore, the quantity of water has an upper limit L5 for providing the washing liquid 3 with washability for only the etching residue. The quantity of water is suppressed below the upper limit L5, so that ionization of the amines is suppressed and the washing liquid 3 has a good washability characteristic for only the etching residue.

Thus, the quantities of water and amines must be maintained in excess of the lower limits L2 and L1, and the quantity of water must further be maintained below the upper limit L5.

Assuming that the quantity L4 of water upon operation starting is 100 percent, the lower limit L2 is 18 percent.

The operation of the washing apparatus shown in FIG. 1 is now described. The operation of the washing apparatus consists of those of the washing part 50 and the supply part 60. The operation of the washing part 50 is first described. In an initial state of the washing part 50, the water and the amines for forming the washing liquid 3 are mixed with each other in the quantities L4 and L6 in the operation starting shown in FIG. 2.

When the washing apparatus starts its operation, the circulating pump 5 circulates the washing liquid 3 successively through the heater 6, the filter 7, the overflow washing tank 2, and the heater 6. The heater 6 heats the washing liquid 3, to keep its temperature at the aforementioned level of 65° C., for example. The washing liquid 3 is adapted to dissolve an etching residue. On the other hand, an etching residue such as resist adheres to the surface of the semiconductor wafer 1. Therefore, the etching residue adhering to the surface of the semiconductor wafer 1 is dissolved in the washing liquid 3 during its circulation. Consequently, the semiconductor wafer 1 is washed. As the time elapses from the operation starting time, the water and the amines which are contained in the washing liquid 3 are evaporated along the characteristic curves shown in FIG. 2, due to the heating and the circulation of the washing liquid 3. The semiconductor wafer 1 as washed is exchanged with a next one to be washed. When all such desired semiconductor wafers are washed, the operation of the washing part 50 is completed.

Figure 3:
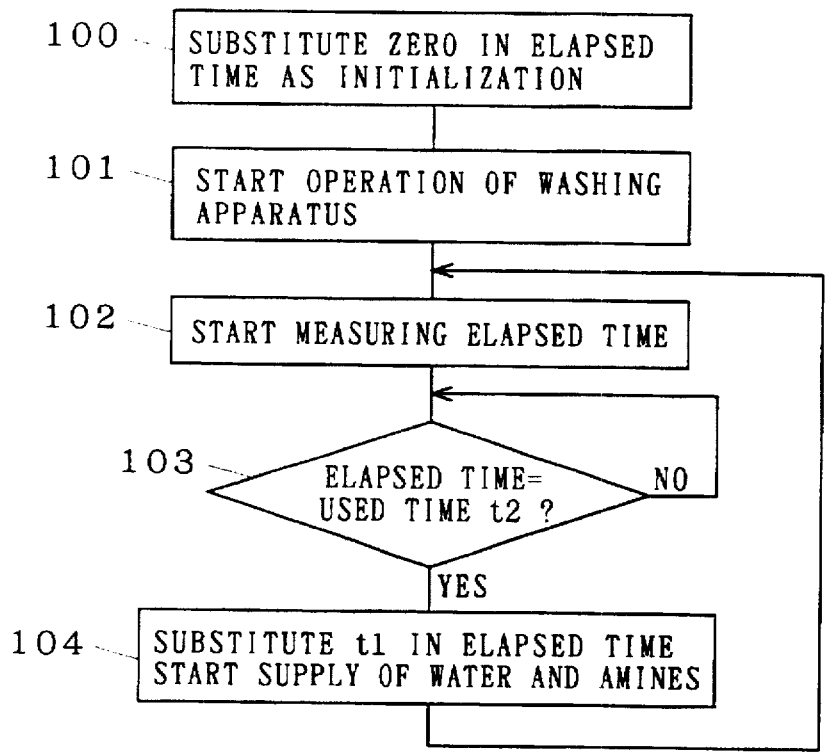
FIG. 3 is a flow chart showing the operation of a supply part 60 of the washing apparatus according to the embodiment 1 of the present invention.

The operation of the supply part 60 is now described. FIG. 3 is a flow chart showing the operation of the supply part 60 of the washing apparatus according to this embodiment. Referring to a step 100, the elapsed time of the timer which is included in the control unit 12 is set at zero as an initial state of the supply part 60. The control unit 12 is so set as to control the tube 9 and the water supplier 10 on the basis of the characteristic curves shown in FIG. 2 for supplying the water and the amines to the overflow washing tank 2.

Referring to a step 101, the washing apparatus (the washing part 50) starts its operation. While the washing apparatus starts its operation, the timer which is stored in the control unit 12 starts measuring the elapsed time from the operation starting of the washing apparatus (step 102). Then, a determination is made as to whether the elapsed time reaches the used time t2 at a step 103. If the determination is of no, the process returns to the step 103.

When the elapsed time reaches the used time t2, the control unit 12 substitutes the used time t1 in the elapsed time at a step 104. At the same time, the control unit 12 controls the water supplier 10 and the amine supplier 11 to start supply of the water and the amines to the overflow washing tank 2. The quantity of the supplied water is obtained by subtracting the water quantity at the used time t2 from that at the used time t1 shown in FIG. 2. The quantity of the supplied amines is also obtained by subtracting the amine quantity at the used time t2 from that at the used time t1 shown in FIG. 2.

Referring to the step 102, the timer which is stored in the control unit 12 starts measuring the elapsed time from the used time t1. Thereafter the loop of the steps 101 to 104 is repeated. When all desired semiconductor wafers are washed and the operation of the washing part 50 is completed, the operation of the supply part 60 is also completed at this time. Thus, the operation of the washing apparatus is completed due to the completion of those of the washing part 50 and the supply part 60.

As described above, the quantities of water and amines are reduced with the used time in the washing part 50. On the other hand, the supply part 60 supplies the washing part 50 with water and amines by the reduced quantities on the basis of the characteristic curves shown in FIG. 2. Also upon a lapse of time from the operation starting, therefore, the quantity of amines is maintained in excess of the lower limit L1, while the quantity of water is maintained in excess of the lower limit L2 and below the upper limit L5.

According to this embodiment, the supply part 60 supplies the washing liquid 3 in response to the characteristic curves thereof, whereby the washability characteristic of the washing liquid 3 can be controlled in the washing part 50. For example, the quantity of amines is maintained in excess of the lower limit L1 while the quantity of water is maintained in excess of the lower limit L2 and below the upper limit L5, whereby the washing liquid 3 can be so controlled that loss of its washability can be suppressed upon a lapse of time from the operation starting.

While the elapsed time is compared with the used time t2 at the step S103, the same may alternatively be compared with the used time between the times t1 and t2, in place of the used time t2. While the elapsed time may alternatively be compared with a used time tx after the used time t2 at the step 103, the same is preferably compared with any used time before the used time t2, since the washing liquid 3 loses its washability between the used times t2 and tx. The used time t1 may be before the used time t2.

Embodiment 2

An embodiment 2 is now described. As shown in FIG. 2, reduction of the quantity of water is larger than that of the quantity of amines, and the used time t2 at which the quantity of water reaches the lower limit L2 is smaller than the used time t3 at which the quantity of amines reaches the lower limit L1. Therefore, the washing liquid 3 loses its washability characteristic at the used time t2.

Thus, the washability characteristic of the washing liquid 3 largely depends on the quantity of water as compared with that of amines. In particular, the used time t2 is immediately reached if the quantity of water is small operation starting time, and hence the dependence on the water is increased as the quantity of water in operation starting is small. If at least the used time t2 is increased, therefore, the life of the washing liquid 3 from the operation starting to loss of its washability characteristic is increased. A technique of increasing the used time t2 thereby lengthening the life of the washing liquid 3 is now described.

The structure of a washing apparatus according to this embodiment is similar to that of the washing apparatus shown in FIG. 1. However, a water supplier 10 is prepared from the so-called tube pump which is employed for a medical purpose or the like. Further, the tube 9 and the amine supplier 11 are removed.

The operation of the washing apparatus according to this embodiment is now described with reference to a washing part 50 and a supply part 60. The operation of the washing part 50 is similar to that in the embodiment 1.

Figure 4:
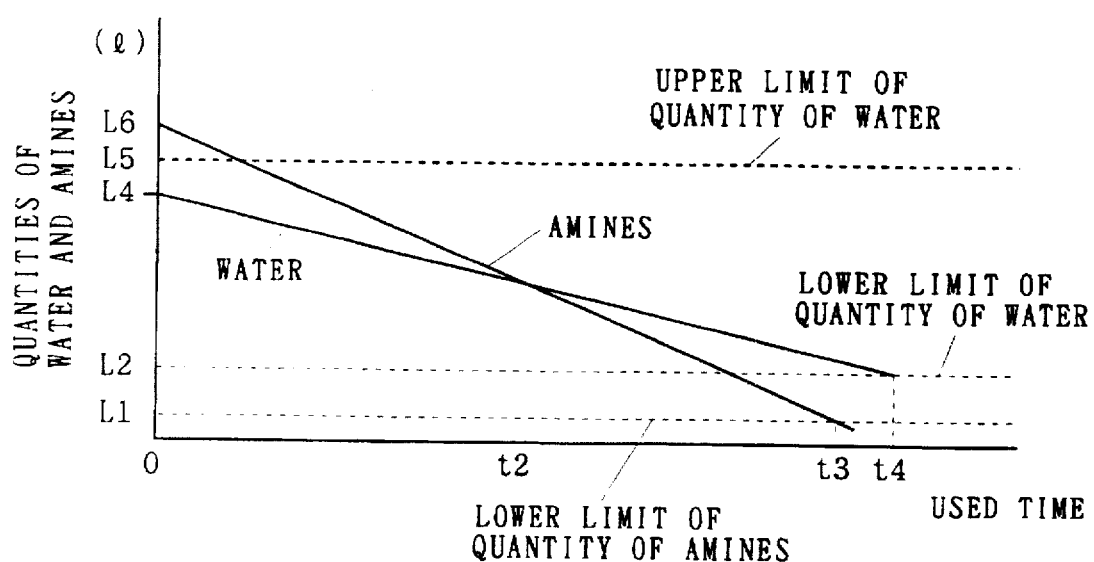
FIG. 4 illustrates changes of quantities of water, amines and still another solution contained in a washing liquid 3 in an embodiment 2 of the present invention.
Figure 5:
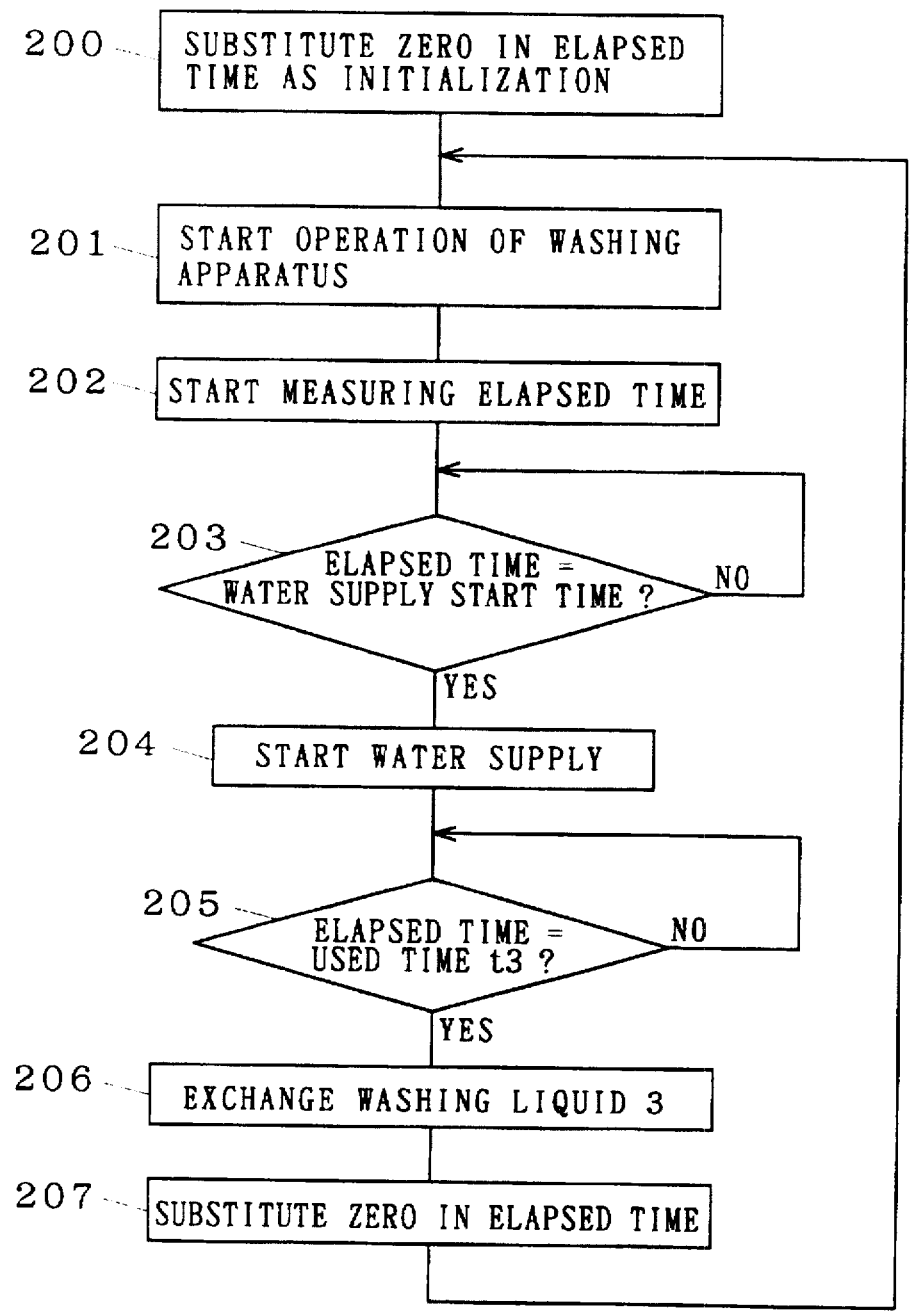
FIG. 5 is a flow chart showing the operation of a supply part 60 of a washing apparatus according to the embodiment 2 of the present invention.

The operation of the supply part 60 is now described. FIG. 4 illustrates changes of quantities of water, amines and other solutions contained in a washing liquid 3 according to this embodiment. FIG. 5 is a flow chart showing the operation of the supply part 60 of the washing apparatus according to this embodiment.

Referring to a step 200, an elapsed time of a timer which is included in a control unit 12 is set at zero as an initial state of the supply part 60. The control unit 12 controls the water supplier 10 on the basis of the characteristic curves shown in FIG. 2, to supply an overflow washing tank 2 with water. Further, it sets a water supply starting time (0 in FIG. 4).

A step 201 is similar to the step 101.

A step 202 is similar to the step 102.

Then, a determination is made as to whether or not the elapsed time reaches the water supply starting time at a step 203. If the determination is of no, the process returns to the step 203. Since the water supply staring time is set at zero according to this embodiment, the process passes through the step 203 and advances to a step 204.

When the elapsed time reaches the water supply starting time, supply of water is started at the step 204. The water is regularly continuously supplied. The water is supplied in a quantity per small time which is smaller than the quantity of small change of water with respect to small change of the used time in starting of water supply (0 in FIG. 4) in the water characteristic curve shown in FIG. 2. The water characteristic curve shown in FIG. 4 is adapted to maintain a substantially constant value L4 as compared with that of FIG. 2. The water characteristic curve is reduced rightward in FIG. 4, since the water is supplied in the aforementioned quantity which is less than the quantity of small change. The quantity of water can be suppressed below an upper limit L5, by supplying the water in the quantity which is less than the quantity of small change.

Referring to a step 205, a determination is made as to whether or not the elapsed time is a used time t3. If the determination is of no, the process returns to the step 205.

When the elapsed time reaches the used time t3, the washing apparatus is temporarily stopped so that the washing liquid 3 in the washing part 50 is exchanged with a new liquid having improved characteristics. The quantities of respective solutions (water, amines and other solutions) contained in the new washing liquid having washability characteristics that are identical to those of the respective solutions in the initial state. Then, the elapsed time of the timer which is included in the control unit 12 is set at zero at a step 207. Referring again to the step 201, the operation of the washing apparatus is started. Thereafter the loop formed by the steps 201 to 207 is repeated. When all of desired semiconductor wafers 1 are washed and the operation of the washing part 50 is completed, the operation of the supply part 60 is also completed at this time. Thus, the operation of the washing apparatus is completed due to the completion of those of the washing part 50 and the supply part 60.

Thus, the quantities of the water and the amines are reduced in the washing part 50 as the used time elapses. On the other hand, the supply part 60 continuously supplies the water by the quantity of reduction on the basis of the characteristic curve shown in FIG. 2 from starting of use, whereby a used time t4 at the lower limit of the water exceeds the used time t3, as shown in FIG. 4. Thus, the period when the washing liquid 3 has an adequate washability characteristic is lengthened by t3–t2.

According to this embodiment, the period when the washing liquid 3 has washability is lengthened also by continuously supplying only water, and the washing liquid can be inhibited from losing its washability in an early stage upon a lapse of time from the operation starting time.

While the water supply starting time is set at zero in FIG. 4, supply of water may be started before the used time t2. As the water supply starting time approaches zero, however, the quantity of water in the washing part 50 regularly approaches that in the initial state upon a lapse of time, whereby stability of the water quantity is increased.

The supply part 60 in this embodiment is a specific case of the supply part 60 in the embodiment 1. Namely, when t2 is made to approach t1 and amines are not supplied by the control unit 12 but moved by the flow chart shown in FIG. 5 in the embodiment 1, an operation which is similar to that of the supply part 60 according to this embodiment is attained.

Further, the amines may be supplied on the basis of the characteristic curve thereof. The period when the washing liquid 3 has an adequate washability characteristic is further lengthened by supplying the amines. In this case, the tube 9 and the amine supplier 11 are provided.

Embodiment 3

A washing apparatus according to this embodiment is similar in structure to that shown in FIG. 1. However, a control unit 12 further includes a water supply period timer for measuring a water supply starting time described later. The tube 9 and the amine supplier 11 are removed. According to this embodiment, water flows into an end of a constant quantity tank (not shown) for storing a constant quantity of water, so that water flowing out from another end of the constant quantity tank is supplied to a water supplier 10.

Figure 6:
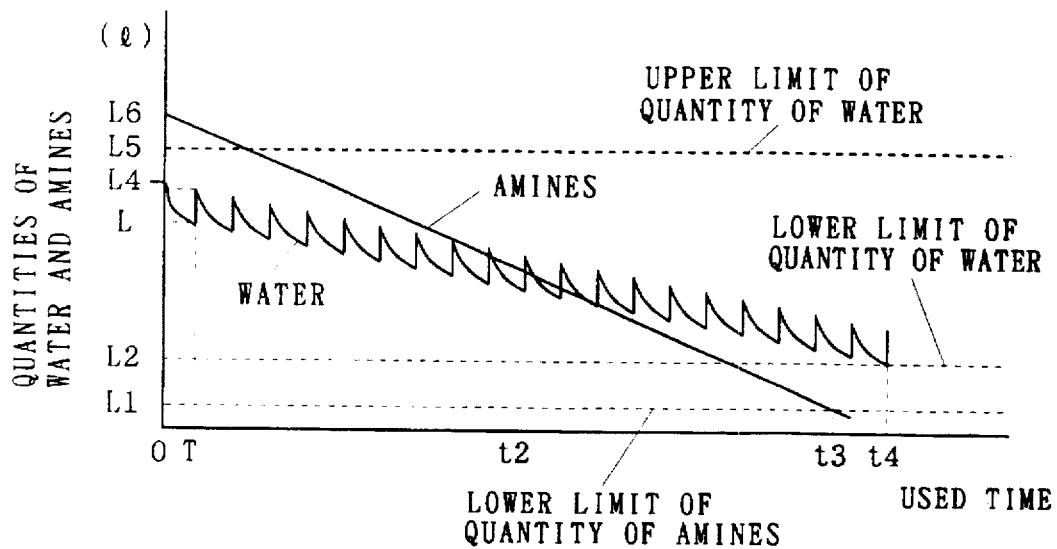
FIG. 6 illustrates changes of quantities of water, amines and still another solution contained in a washing liquid 3 in an embodiment 3 of the present invention.

The operation of the washing apparatus according to this embodiment is now described. The principal operation of the washing apparatus according to this embodiment is similar to that of the washing apparatus according to the embodiment 2. FIG. 6 illustrates changes of the quantities of water, amines and other solutions which are contained in a washing liquid 3 according to this embodiment. While the water is continuously supplied in the embodiment 2, this embodiment is adapted to intermittently supply the water, as shown in FIG. 5. While the principal operation of the washing apparatus according to this embodiment is similar to that shown in the flow chart of FIG. 6, the water supply operation at the step 204 is different.

Figure 7:
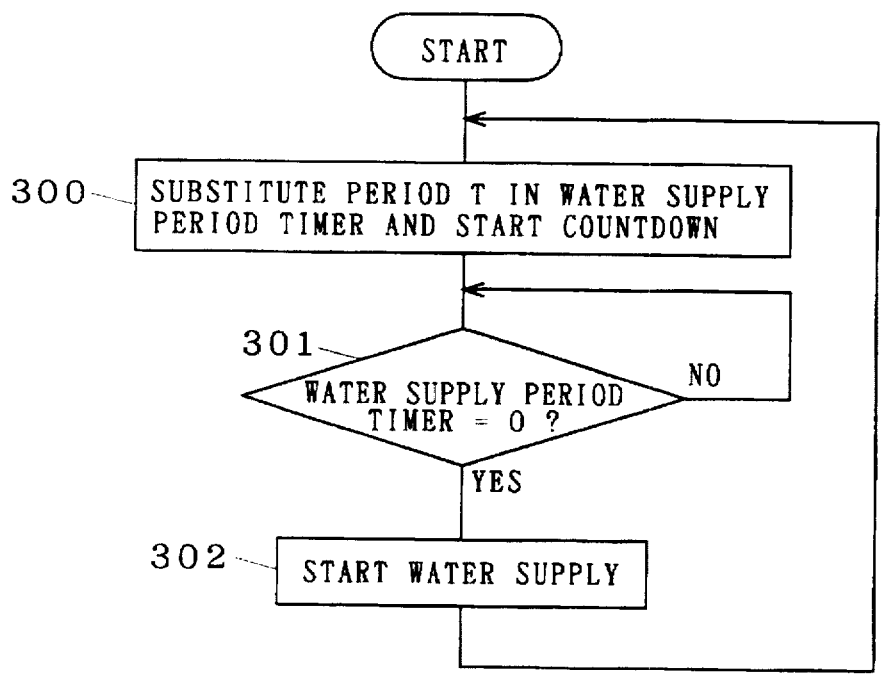
FIG. 7 is a flow chart illustrating a water supply operation at a step 204 shown in FIG. 5 in an embodiment 3 of the present invention in detail.

FIG. 7 is a flow chart illustrating the water supply operation at the step 204 in detail.

Following the step 204 shown in FIG. 5, the process advances to the step 205 as well as to a step 300. Referring to the step 300, a period T is substituted in the water supply period timer. Then, a countdown for the water supply period timer is started. Referring to a step 301, a determination is made as to whether or not the value of the water supply period timer is zero. If the determination is of no, the process returns to the step 301.

When the value of the water supply period timer reaches zero, supply of water is started at a step 302. The quantity of the supplied water is below a quantity of change which is obtained by subtracting the quantity of water at the current time, i.e., at a point of time when the time T elapses from starting of use, from the quantity of water at the starting of use shown in FIG. 6. The water is stored in the aforementioned constant quantity tank in this quantity, so that the water supplier 10 supplies an overflow washing tank 2 with this water. Referring to FIG. 6, the characteristic curve of water is reduced rightward since the water is supplied in a quantity which is less than the aforementioned quantity of change. The quantity of water can be suppressed below an upper limit L5 by supplying the water in a quantity which is less than the quantity of change.

Thereafter the process returns to the step 300. The loop of the steps 300 to 302 is repeated.

When the elapsed time reaches the used time t3 at the step 205 shown in FIG. 5, the operation at the steps 300 to 302 is completed.

Thus, the quantities of the water and amines are reduced in the washing part 50 as the used time elapses. On the other hand, a supply part 60 intermittently supplies the water by the quantity of reduction on the basis of the characteristic curve shown in FIG. 2 from starting of use, whereby a used time t4 at the lower limit of the water quantity exceeds the used time t3, as shown in FIG. 6. Thus, the period when the washing liquid 3 has washability is lengthened by t3–t2.

According to this embodiment, the period when the washing liquid 3 has washability is lengthened simply by intermittently supplying only water, and the washing liquid 3 can be inhibited from losing its washability in an early stage upon a lapse of time from operation starting.

The supply part 60 in this embodiment is a specific case of the supply part 60 in the embodiment 1. Namely, when t2 is made to approach t1 and amines are not supplied by the control unit 12 but moved by the flow chart shown in FIG. 7 in the embodiment 1, an operation which is similar to that of the supply part 60 according to this embodiment is attained.

Further, the amines may be supplied similarly to the water supply. The period when the washing liquid 3 has washability is further lengthened by supplying the amines. In this case, the tube 9 and the amine supplier 11 are provided.

Embodiment 4

Figure 8:
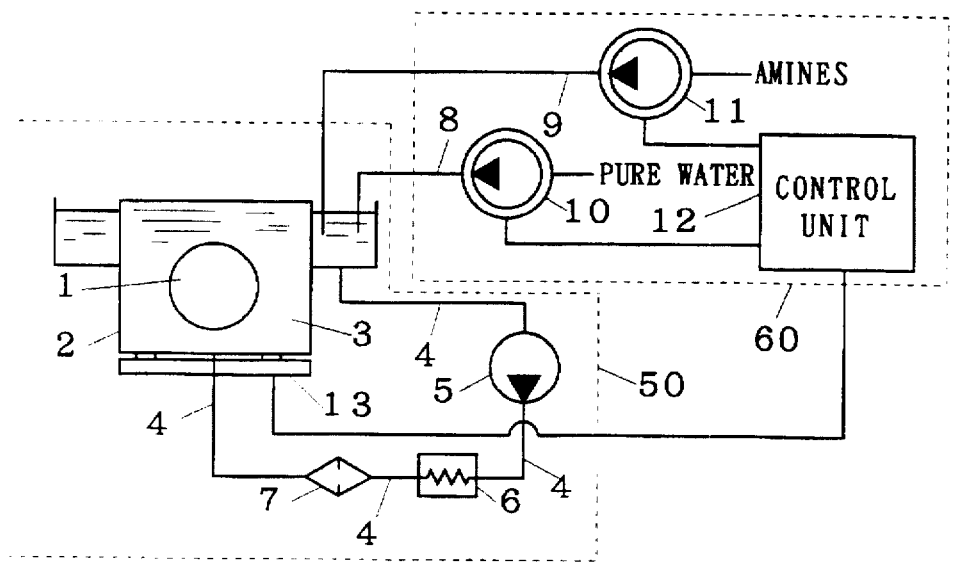
FIG. 8 illustrates a washing apparatus for a semiconductor wafer employing water and amines according to an embodiment 4 of the present invention.

FIG. 8 illustrates a washing apparatus for a semiconductor wafer employing water and amines according to an embodiment 4 of the present invention. Referring to FIG. 8, numeral 13 denotes a solution weight sensor which is weight measuring means for measuring the weights of water and amines, and the remaining numerals correspond to those in FIG. 1.

The structure is now described. The solution weight sensor 13 is provided under an overflow washing tank 2. The solution weight sensor 13 is connected with a control unit 12. The remaining structure is similar to that shown in FIG. 1. However, the timer is removed. The solution weight sensor 13 is included in a supply part 60.

The operation of the washing apparatus according to this embodiment is now described with reference to a washing part 50 and the supply part 60. First, the operation of the washing part 50 is similar to that in the embodiment 1.

Figure 9:
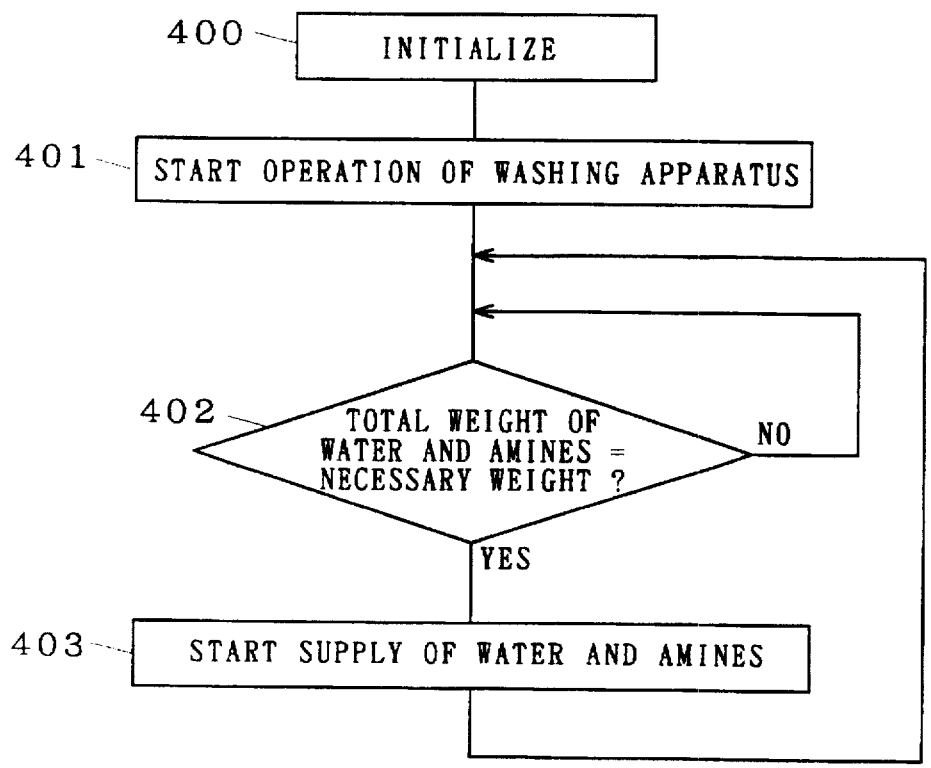
FIG. 9 is a flow chart showing the operation of a supply part 60 of a washing apparatus according to the embodiment 4 of the present invention.

The operation of the supply part 60 is now described. FIG. 9 is a flow chart showing an exemplary operation of the supply part 60 of the washing apparatus according to the embodiment 4 of the present invention.

Referring to a step 400, the control unit 12 stores the respective weights of the overflow washing tank 2, the water, the amines and the remaining solutions, as an initial state of the supply part 60. Further, the total weight of the water and amines at the used time t2 shown in FIG. 2 is set as a necessary weight.

At a step 401, monitoring of the weight of the overflow washing tank 2 is started in addition to the operation at the step 101. The control unit 12 subtracts the total weight of the overflow washing tank 2 and the remaining solutions other than the water and amines from the weight measured by the solution weight sensor 13, thereby detecting the total weight of the water and amines. Thereafter the total weight of the water and amines is monitored only while a semiconductor wafer 1 is stored in the overflow washing tank 2.

At a step 402, a determination is made as to whether or not the total weight of the water and amines is identical to the necessary weight of the monitored washing liquid 3. If the determination is of no, the process returns to the step 402.

If the total weight of the water and amines is identical to the minimum necessary weight, supply of water is started at a step 403. The water is supplied by a quantity which is obtained by subtracting the water quantity at a point of time when the total weight of the water and amines becomes identical to the minimum necessary weight (elapsed time t2 shown in FIG. 2) from the water quantity at the operation starting in the characteristic curve shown in FIG. 2. The amines are also supplied by a quantity which is obtained by subtracting the quantity of amines at the aforementioned point of time from that in the operation starting.

Then, a determination is made again at the step 402 as to whether or not the total weight of the water and amines is identical to the necessary weight of the monitored washing liquid 3. Thereafter the steps 402 and 403 are repeated. When all desired semiconductor wafers are washed in the washing part 50 and its operation is completed, the operation of the supply part 60 is also completed at this time. Thus, the operation of the washing apparatus is completed due to completion of the operations of the washing part 50 and the supply part 60.

Thus, the quantities of the water and amines are reduced in the washing part 50 as the used time elapses. On the other hand, the supply part 60 supplies the water by the quantity of reduction on the basis of the characteristic curve shown in FIG. 2. Therefore, the quantities of the water and amines are not reduced but maintained at constant values upon a lapse of time from operation starting.

According to this embodiment, the quantities of water and amines are maintained constant, whereby the washing liquid can be inhibited from losing its washability upon a lapse of time from operation starting. Further, the quantity of the washing liquid 3 can be correctly managed by directly measuring the weight thereof through the solution weight sensor 13.

Alternatively, only water may be supplied. Description is now made on the washing apparatus in case of supplying only water is now described. As to the structure of the washing apparatus, the control unit 12 is provided with a timer. The tube 9 and the amine supplier 11 are removed.

The operation is now described. The operation of the washing apparatus is mainly similar to that of the flow chart shown in FIG. 9. While the necessary weight at the step 402 may be the aforementioned weight when the process first advances to this step, the same must be corrected when the process returns to the step 402 next, since no amines are supplied. At the step 403, only water is supplied in the aforementioned quantity while a quantity which is obtained by subtracting the aforementioned supply quantity of amines from the necessary weight is set as the necessary weight. At the step 400, further, zero is substituted in the elapsed time measured by the timer. At the step 401, the operation of the washing apparatus is started and the elapsed time is measured by the timer, so that the washing apparatus is temporarily stopped and the washing liquid 3 of the washing part 50 is exchanged with a new one having washability when the elapsed time reaches the used time t3. The quantities of respective solutions (water, amines and other solutions) contained in the new washing liquid having washability are identical to those in the initial state. After the exchange, the operation is started from the step 400. Thereafter the steps 400 to 403 are repeated. When all desired semiconductor wafers are washed in the washing part 50 and its operation is completed, the operation of the supply part 60 is also completed at this time. Thus, the operation of the washing apparatus is completed due to completion of the operations of the washing part 50 and the supply part 60.

Thus, the period when the washing liquid 3 has washability is lengthened by t3–t2 also when only water is supplied.

Embodiment 5

Figure 10:
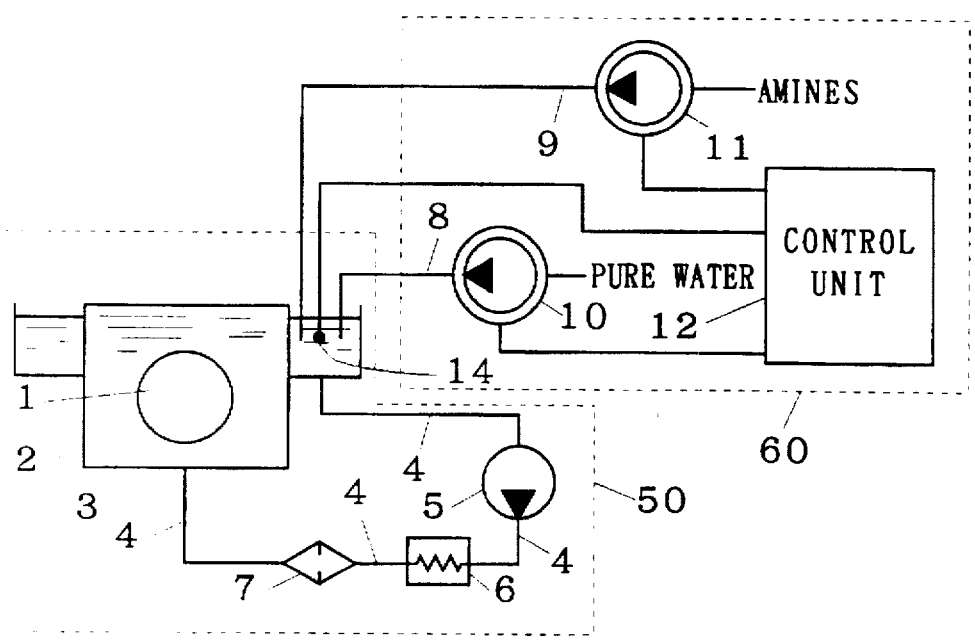
FIG. 10 illustrates a washing apparatus for a semiconductor wafer employing water and amines according to an embodiment 5 of the present invention.

FIG. 10 illustrates a washing apparatus for a semiconductor wafer employing water and amines according to an embodiment 5 of the present invention. Referring to FIG. 10, numeral 14 denotes a concentration sensor which is concentration measuring means for measuring the concentration of water or amines, and the remaining numerals correspond to those in FIG. 1.

The structure is now described. An end of the concentration sensor 14 is provided in an overflow washing tank 2. The other end of the concentration sensor 14 is connected with a control unit 12. The remaining structure is similar to that shown in FIG. 1. However, the tube 9 and the amine supplier 11 may be omitted. The concentration sensor 14 is included in a supply part 60.

The operation of the washing apparatus according to this embodiment is now described. The washing apparatus according to this embodiment is similar in principal operation to the washing apparatus according to the embodiment 3. Particularly in this embodiment, the quantity of intermittently supplied water is adjusted on the basis of the concentration sensor 14. While the principal operation of the washing apparatus according to this embodiment is similar to those of the flow charts shown in FIGS. 5 and 7, the water supply operation at the step 302 shown in FIG. 7 is different.

Figure 11:
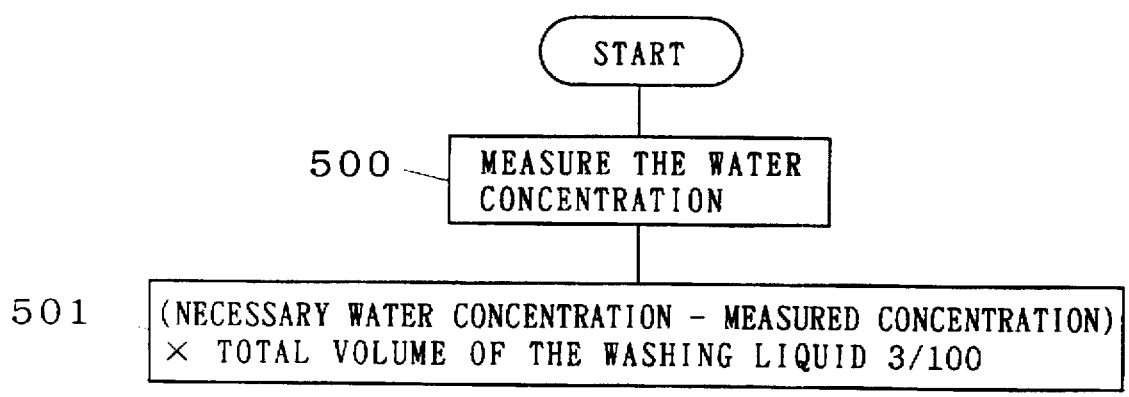
FIG. 11 is a flow chart showing the operation of a supply part 60 of a washing apparatus according to the embodiment 5 of the present invention.

FIG. 11 is a flow chart showing the water supply operation at the step 302 in detail.

Following the step 302 shown in FIG. 7, the process returns to the step 300 and simultaneously advances to a step 500. Referring to the step 500, the concentration sensor 14 measures the water concentration as measured concentration. Then, water supply is started at a step 501. The quantity of the supplied water is:

(necessary water concentration−measured concentration)
×total volume of the washing liquid 3/100 (unit:liter)

The necessary water concentration is previously set at the step 200 shown in FIG. 5.

Thus, the quantities of the water and amines are reduced in a washing part 50 as the used time elapses. On the other hand, a supply part 60 intermittently supplies water by a quantity which is calculated on the basis of the concentration measured by the concentration sensor 14 from starting of use, whereby the used time t4 at the lower limit of the water quantity exceeds t3 as shown in FIG. 6. Thus, the period when the washing liquid 3 has washability is lengthened by t3–t2.

According to this embodiment, the period when the washing liquid 3 has washability is lengthened simply by intermittently supplying only water through the concentration sensor 14, and the washing liquid 3 can be inhibited from losing its washability in an early stage upon a lapse of time from operation starting. Further, the quantity of the washing liquid 3 can be correctly managed by directly measuring the concentration of the washing liquid 3 with the concentration sensor 14.

Figure 12:
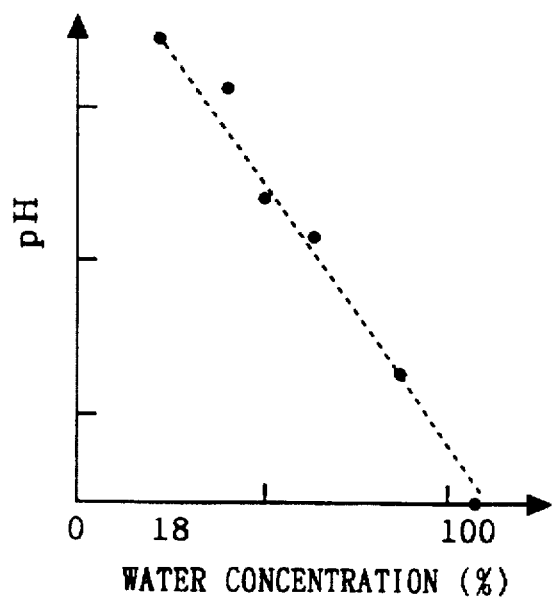
FIG. 12 illustrates the relation between water concentration and pH.

The concentration sensor 14 may be a pH meter. FIG. 12 illustrates the relation between the water concentration and the pH. The pH is measured with the pH meter. The control unit 12 measures the water concentration as the aforementioned measured concentration, on the basis of the characteristic curve indicating the relation between the water concentration and the pH shown in FIG. 12. Referring to FIG. 12, it is assumed that the quantity of water in an initial state is 100 percent on the axis of abscissas.

Alternatively, the concentration sensor 14 may be an oxidation-reduction potentiometer. An obtained potential is measured by the oxidation-reduction potentiometer. The control unit 12 measures the water concentration as the aforementioned measured concentration on the basis of a characteristic curve indicating the relation between the water concentration and the potential which are in one-to-one correspondence to each other, similarly to the characteristic curve indicating the relation between the water concentration and the pH shown in FIG. 12.

Amines may be supplied similarly to the water supply. The period when the washing liquid 3 has washability is further lengthened by supplying the amines.

Embodiment 6

An embodiment 6 is now described. According to each of the embodiments 1 to 3, the supply part 60 supplies water and amines on the basis of the characteristic curves shown in FIG. 2. Therefore, it is impossible to predict abrupt reduction of the washing liquid 3 which is caused by its partial discharge from the overflow washing tank 2 upon exchange of the semiconductor wafer 1 in the washing part 50 or the like. When the washing apparatus is driven while neglecting the unpredictable reduction, the washing liquid 3 is hardly present in the overflow washing tank 2 if things comes to the worst. According to this embodiment, therefore, the washing liquid 3 is supplemented for the unpredictable reduction.

A washing apparatus according to this embodiment is similar in structure to the washing apparatus shown in FIG. 8. The operation is now described. In the washing apparatus according to this embodiment, an operation of supplementing the washing liquid 3 for unpredictable reduction is added to an operation which is identical to that of the embodiment 1, 2 or 3. The supplementary operation is now described.

It is assumed that the quantity of the washing liquid 3 is abruptly reduced simultaneously with exchange of the washing liquid 3 during the operation of the washing apparatus due to discharge from an overflow washing tank 2. Then, a liquid weight sensor 13 measures the quantity of the abrupt reduction of the washing liquid 3. A determination as to whether or not the reduction of the washing liquid 3 is abrupt is made by determining whether the quantity of the reduced washing liquid 3 is larger or smaller than a previously set quantity of reduction of the washing liquid 3. If the quantity of the reduced washing liquid 3 is larger than the previously set quantity, water and amines are supplied by the reduced quantity of the washing liquid 3.

The abruptly reduced washing liquid 3 contains water, amines and other solutions, as a matter of course. The supply quantities of water and amines are obtained from the ratios of the quantities of water and amines at the point of time when reduction of the washing liquid 3 is caused. The solutions other than the water and amines are regarded as being in extremely small quantities and not supplied. When these solutions are also supplied, it is necessary to further provide a supplier, which is controlled by a control unit 12, for supplying these solutions.

According to this embodiment, the optimum quantity of the washing liquid 3 which is necessary for washing the semiconductor wafer 1 can be maintained by supplementing the washing liquid 3 for unpredictable reduction.

While the washing liquid 3 containing water and amines is employed in every embodiment, the present invention is also applicable to another washing liquid. The washing liquid 3 containing water and amines is a washing liquid forming the main stream in the future, and hence the above description has been made on such a washing liquid 3 containing water and amines.

While the invention has been shown and described in detail, the foregoing description is in all aspects illustrative and not restrictive. It is therefore understood that numerous modifications and variations can be devised without departing from the scope of the invention.

What is claimed is:

1. A washing apparatus comprising:
a washing part configured to wash a wafer therein with a washing liquid, said washing liquid having a property such that a quantity of said washing liquid is reduced in relation to an amount of operating time that said washing liquid is used and a total amount of said washing liquid contained therein; and a supply part configured to supply said washing part with an additional amount of said washing liquid so that said quantity of said washing liquid in said washing part is kept within a predetermined range, said supply part comprising,
  a controller configured to predict said quantity of said washing liquid as a function of operating time and said total amount of said washing liquid, said controller being configured to control said supply of said additional amount of said washing liquid based the quantity predicted so as to keep said quantity of washing liquid within said predetermined range.

2. The washing apparatus in accordance with claim 1, wherein:
  said washing liquid comprises a plurality of solutions, each of said plurality of solutions having respective properties that cause respective quantities of said plurality of solutions to be reduced as a function of operating time;
  said controller being configured to predict when a respective quantity of one of said solutions becomes less than a predetermined amount so that said controller controls said supply part to supply an additional amount of said one of said solutions such that a washing effectiveness of said washing liquid is preserved.

3. The washing apparatus in accordance with claim 2, wherein said plurality of solutions comprises water and amines.

4. The washing apparatus in accordance with claim 3, wherein:
  said washing part comprises,
    a washing tank in which said wafer is washed with said washing liquid,
    a filter for filtering said washing liquid extracted from said washing tank,
    circulating means for passing said washing liquid extracted from said washing tank through said filter and then back to said washing tank, and
    temperature control means for controlling a temperature of said washing liquid; and
  said supply part comprises,
    water supply means for supplying said washing tank with said water, wherein said control means controls said water supply means by adjusting an amount of water supplied therethrough.

5. The washing apparatus in accordance with claim 4, wherein said supply part further comprises:
  amine supply means for supplying said washing tank with said amines; and wherein
  said control means controls said water supply means and said amine supply means by adjusting the supply quantities of said water and said amines.

6. The washing apparatus in accordance with claim 1, wherein said supply part further comprises:
  weight measuring means for measuring the weight of said washing liquid, said washing liquid being supplied also by a result of measurement of said weight measuring means.

7. The washing apparatus in accordance with claim 1, wherein said supply part further comprises:
  concentration measuring means for measuring the concentration of said washing liquid, said washing liquid being supplied also by a result of measurement of said concentration measuring means.

* * * * *